United States Patent [19]

Hara

[11] Patent Number: 4,697,073
[45] Date of Patent: Sep. 29, 1987

[54] IC CARD

[75] Inventor: Kazuya Hara, Tokyo, Japan

[73] Assignee: Casio Computer Co., Ltd., Tokyo, Japan

[21] Appl. No.: 833,058

[22] Filed: Feb. 24, 1986

[30] Foreign Application Priority Data

Mar. 4, 1985 [JP] Japan .................................. 60-43301

[51] Int. Cl.⁴ ............................................ G06K 19/00
[52] U.S. Cl. .................................... 235/487; 235/492
[58] Field of Search ................................ 235/487, 492

[56] References Cited

U.S. PATENT DOCUMENTS 4,592,870 7/1985 Chaum ............................ 235/487 X Primary Examiner—Harold I. Pitts
Attorney, Agent, or Firm—Frishauf, Holtz, Goodman & Woodward

[57] ABSTRACT

In an IC card, contact pads 7A and wiring patterns 7B are formed on a sheet-like structure and contact segments 7-1 to 7-8 are formed on the contact pads 7A. Main chip 5 and sub-chip 6 are mounted on the sheet-like structure. A sheet film is laminated on the sheet-like structure and the contact segments are fitted in openings of the sheet film. The sheet film has a thickness substantially equal to that of the contact segments.

13 Claims, 7 Drawing Figures

IC CARD

BACKGROUND OF THE INVENTION

This invention relates to IC cards.

Recently, various IC cards have been developed, and their improvements have been proposed. U.S. patent specification 4,216,577 (Bernard et al) discloses such an IC card. In the disclosed IC card, an IC chip is mounted on a circuit board with terminals, to which signal and power source voltage are supplied. The circuit board with the IC chip is secured to a hard resin sheet, and is covered by a sheet or film having holes, which correspond to and expose the terminals of the circuit board. In this prior art IC card, the terminals which are provided in the holes of the cover sheet are depressed in level from the top surface of the film to an extend substantially corresponding to the thickness of the cover sheet. Therefore, dust is liable to be collected in the holes, giving rise to failure of the electric connection between the IC card terminals and external device.

The ISO (International Standardization Organization) proposes that four contact segments formed in the IC card are arranged in two rows and the internal between the two rows is 5.62 mm. In the disclosed IC chip noted above, on the other hand, an IC chip is provided between contact rows. With this structure, it is necessary to provided in a 5.62-mm space if the ISO standards are to be conformed. To do so, however, involves difficulties in actual manufacture. In addition, in this structure, probes are contacted to the contacts and the pressure is applied to the contacts from the probes, and this will lead to rupture of the IC chip.

Further, recently it has been considered to store transaction data in IC chips. Doing so, however, requires an increased memory capacity. This is said to require provision of two IC chips in the IC card.

SUMMARY OF THE INVENTION

An object of the invention is to provide a highly reliable IC card, which can eliminate connection failure due to collection of dust between the IC card terminals and external device.

According to the invention, there is provided an IC card comprising:

at least one IC chip having electrical terminals to be connected to an external device;

a sheet-like structure having one surface and supporting said IC chip;

internal connecting members formed on said one surface of said sheet-like structure and including a plurality of connection pads and wiring patterns connecting said connection pads to said electrical terminals of said IC chip;

a sheet film having openings facing said connection pads and covering said one surface of said sheet-like structure; and contact segments formed on said connection pads, having a thickness substantially equal to the thickness of said sheet film and fitted in said first openings.

DETAILED DESCRIPTION OF THE PREFERRED EMBODIMENT

Figure 1:
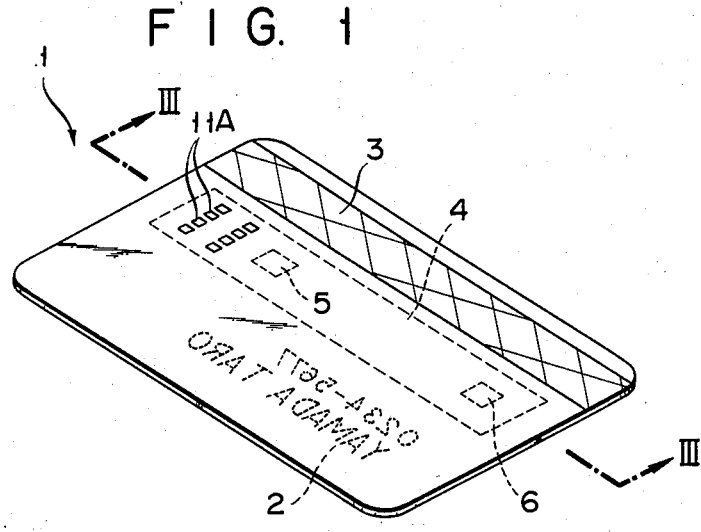
FIG. 1 is a schematic perspective view showing an embodiment of the IC card according to the invention.

FIG. 1 is a perspective view showing an embodiment of IC card 1 according to the invention. This IC card, as shown in FIG. 1, is a rectangular plate having flexibility. It is 85.5 mm in length, 54 mm in width and 0.8 mm in thickness. One of its surfaces, e.g., the front surface, has embossing 2 of the owner's code or name. The other surface, e.g., back surface, has magnetic stripe 3 having owner's information, e.g., code number or account number. Embossing 2 and magnetic stripe 3 are provided such that they extend in the longitudinal direction of IC card 1. IC card 1 has a plurality of holes or recesses 11A, which are formed in an area of the back surface near a longitudinal end portion and substantially in a transversal center. Contacts to be connected to an external device are accommodated in holes 11A. The back surface is substantially flat. IC card 1 accommodates substrate 4 with main chip 5 and sub-chip 6 mounted thereon.

Figure 2:
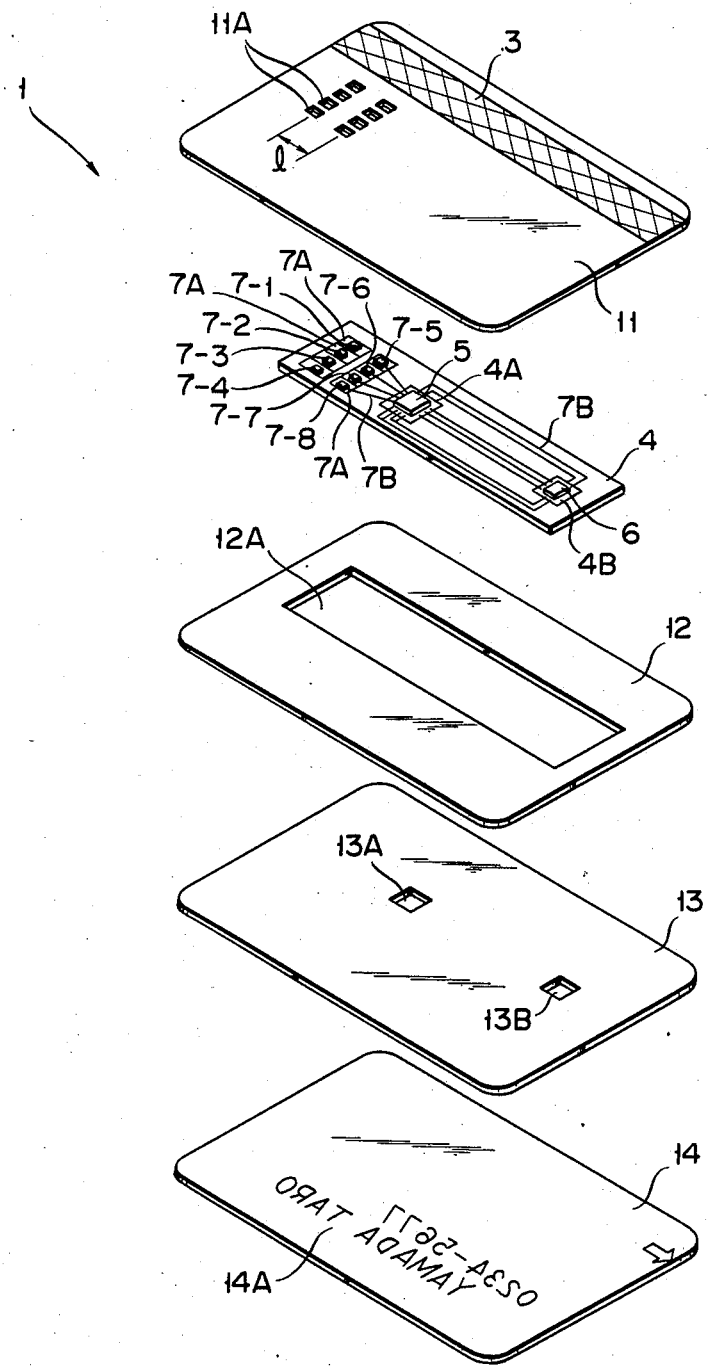
FIG. 2 is a perspective view showing an IC card shown in FIG. 1.

The structure of IC chip 1 shown in FIG. 1 will be described in detail with reference to FIGS. 2 and 3. The structure comprises transparent top sheet 11 of vinyl chloride or polyester. It has magnetic stripe 3 formed on the front surface and a decorative impression provided on the rear surface. It has eight holes 11A arranged in two rows each of four holes, the rows being spaced apart by a distance of $l=5.62$ mm. Holes 11A have a size conforming to or slightly greater than the ISO standards and are formed at position conforming to the ISO standards.

Disposed under top sheet 11 is substrate 4 made of bismaleimide-triazine, glass epoxy resin, etc. Substrate 4 has holes 4A and 4B. Main chip 5 and sub-chip 6 having respective internal LSIs (large scale integrated circuits) are accommodated in holes 4A and 4B. Substrate 4 has conductor 7. Conductor 7 has connection terminals or pads 7A to be connected to an external circuit and a wiring pattern connecting terminals 7A to terminals of main chip 5 and sub-chip 6. Conductor 7 is made of a copper foil. Each terminal 7A has a greater size than opening 11A provided in top sheet 11. Contact segments 7-1 to 7-8 are formed by copper plating on terminals 7A such that they project from the surface of substrate 4. More specifically, conductive foil 7 is formed by copper plating on the substrate, then a plating resist is provided except for portions provided with the contact sections, and then copper plating is provided once again, so that contact segments 7-1 to 7-8 project. Terminals 7A and contact segments 7-1 to 7-8 are preferably covered by gold plating. Contact segments 7-1 to 7-8 have a size substantially equal to or slightly smaller than hole 11A of top film 11. More specifically, contact segments 7-1 to 7-8 have a size substantially conforming to ISO standards of a length of 2 mm and a width of 1.7 mm.

Contact segments 7-1 to 7-8 are arranged at interval similar to the case of holes 11A in two rows each of four lines. When contact segments 7-1 to 7-8 are fitted in holes 11A of top sheet 11, holes 11A are filled with contact segments 7-1 to 7-8. Besides, the areas of top film 11 where holes 11A are flush with the rest of the surface, that is, there is no step. Therefore, no dust particles are collected in holes 11A. In the above described embodiment, each connecting terminals 7A is formed in a larger size than that of each contact segments 7-1, 7-8 so that even it small gaps are produced between the opening 11A and the contact segments, parts of the connecting terminals 7A are exposed through the gaps. Thereby, IC card always has a good appearance. Contact segments 7-1 to 7-8 constitute VDD terminal 7-1 for power supply, reset terminal 7-2, clock terminal 7-3, GND terminal 7-5, VCC terminal 7-6, to which a voltage is applied when writing transaction information to be described later, and address data input terminal 7-7. Contact segments 7-4 and 7-8 are provided as spare contact sections, and no signal is fed to them in this embodiment.

The connection between terminal of main chip 5 and wiring pattern 7b is effected when providing pellet 5A on the substrate during manufacture of main chip 5. Main chip 5 is fablicated by forming an integrated circuit in a wafer, then providing gold bumpers 5B on the wafer, then dicing the system to separate pellet 5A, then providing lead 5C made of a tin-plated copper foil such that it faces each gold bumper 5B, and finally effecting inner lead bonding. During this process, lead 5C which is bonded to a tape carrier (not shown) is cut to be separated from the tape carrier. At the time of the separation, one end portion is connected by inner lead bonding to gold bumper 5B, and the other end is overlapped over wiring pattern 7B surrounding hole 4A and connected by outer lead bonding thereto. After completion of the connection, a resin is molded on the surface of main chip 5, thus completing the main chip. The fablication of sub-chip 6 and mounting thereof on substrate 4 are the same as for the main chip, so their description is omitted. Pellet 6A, gold bumper 6B, lead 6C and resin molding 6D of sub-chip 6 shown in FIG. 3 correspond to pellet 5A, gold bumper 5B, lead 5C and resin molding 5D of main chip 5, respectively.

Figure 3:
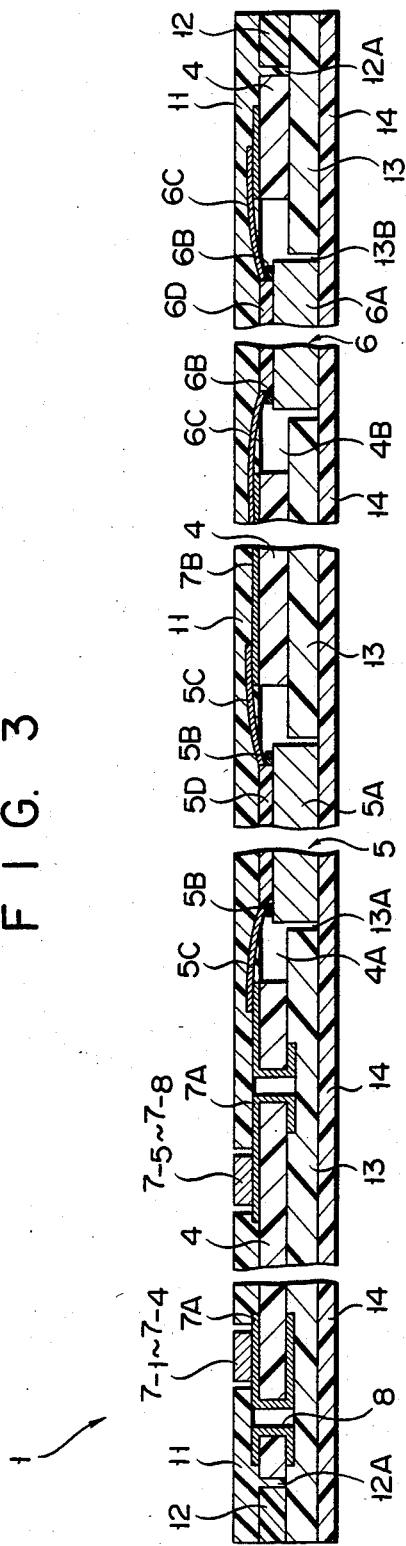
FIG. 3 is a sectional view taken along line III—III in FIG. 1.

As shown in FIG. 3, terminals 7A which are connected to contact segments 7-1 to 7-8 extend into through hole 8. Terminals 7A which are connected to contact segments 7-1 to 7-4, although not clearly shown in FIG. 3, are connected leads of main chip 5 through wiring pattern 7B provided on the back surface of substrate 4. Terminals 7A connected to contact segments 7-5 to 7-8 are connected to leads of main chip 5 through wiring pattern 7B provided on the top surface of substrate 4.

Substrate 4 with main chip 5 and sub-chip 6 mounted thereon, is accommodated in an opening 12A of upper sheet 12, opening 12A having substantially the same size the substrate 4. Upper sheet 12 is made of a hard vinyl chloride resin or a polyester resin. It has substantially the same thickness as substrate 4. Substrate 4 thus is accommodated in opening 12A of upper sheet 12 substantially in close contact therewith, that is, it has a substantially fixed position relative to upper sheet 12. Main chip 5 and sub-chip 6, however, have a greater thickness than substrate 4. They are thus retained in the substrate with their lower portion projecting therefrom. Therefore, lower portions of pellets 5A and 6A project from the back surface of upper sheet 12 with the substrate mounted therein, as shown in FIG. 3. Lower sheet 13 is laminated in close contact with the lower surface of upper sheet 12. Lower sheet 13 has holes 13A and 13B, which has a size sufficiently smaller than holes 12A of upper sheet 12 and substantially the same as pellets 5A and 6A and are arranged under the holes 12A. When upper and lower sheets 12 and 13 are laminated in close contact with each other, lower portions of pellets 5A and 6A projecting from the back side of upper sheet 12 are snugly received in holes 13A and 13B.

Transparent back sheet 14 is provided in close contact with the back surface of lower resin sheet 13. The inner surface of back sheet 14 has a print of owner's code and owner's name 14A. Although not shown, the entire surface of bottom sheet 14 is provided with a decorative print in colors different from the print of owner's code and owner's name.

IC card 1 having the above construction is assembled as follows.

As has been described above, conductor 7 consisting of terminal sections or contact pads 7A and wiring pattern sections 7B are formed on substrate 4. Contact segments 7-1 to 7-8 are formed on terminal section 7a such that they projected therefrom. Main chip 5 and sub-chip 6 are then mounted on substrate 4 in the manner as described before. Then, bottom sheet 14, lower resin sheet 13 and upper resin sheet 12 are laminated in the mentioned order, and substrate 4 with main chip 5 and sub-chip 6 is set in opening 12A of upper resin sheet 12. In this state, holes 13A and 13B of lower resin sheet 13 correspond pellets 5A and 6A, and portions thereof projecting from the lower surface of upper resin sheet 13 are received in holes 13A and 13B. Top sheet 11 then is laminated from above. The system thus obtained is then treated with a thermal press. Where top sheet 11, upper and lower resin sheets 12 and 13 and bottom sheet 14 are made of a vinyl chloride resin, the individual sheets are bonded together with the melting of the vinyl chloride resin in the thermal press. Where the sheets are made of polyester, they may be bonded together with an adhesive provided between adjacent ones of them using a press.

Figure 4:
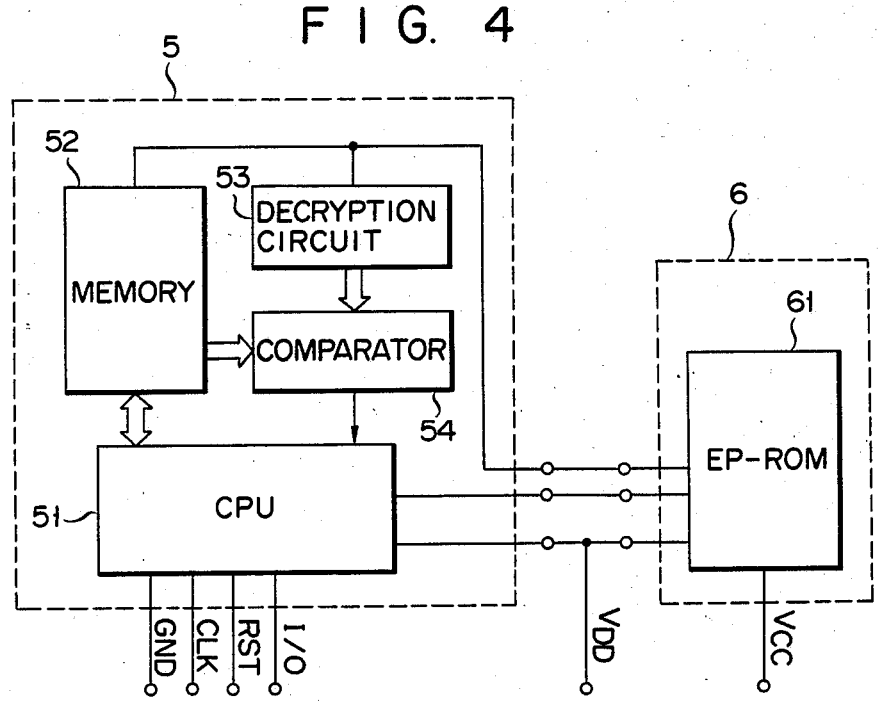
FIG. 4 is a block diagram showing a circuit structure of a main chip and a sub-chip assembled in the structure showm in FIG. 4.

Afterwards, top sheet 11 is embossed to form embossing 14A of the owner's code and owner's name. The electric circuit of main chip 5 and sub-chip 6 will now be described with reference to FIG. 4.

In the above embodiment of IC card 1, a data memory part is provided as a separate chip in order to provided an increased data storage capacity of the IC card.

More specifically, main chip 5 includes CPU 51, memory 52, decryption circuit 53 and comparator 54. Subchip 6 has EP-ROM (erasable and programmable read-only memory) 61. Of contact segments 7-1 to 7-8 of substrate 4, those constituting I/O (input/output) terminal, RST (reset) terminal, CLK (clock) terminal and GND terminal are connected to main chip 5, that constituting $V_{CC}$ terminal is connected to sub-chip 6, and that constituting $V_{DD}$ terminal is connected to main chip 5 and sub-chip 6.

Figure 5:
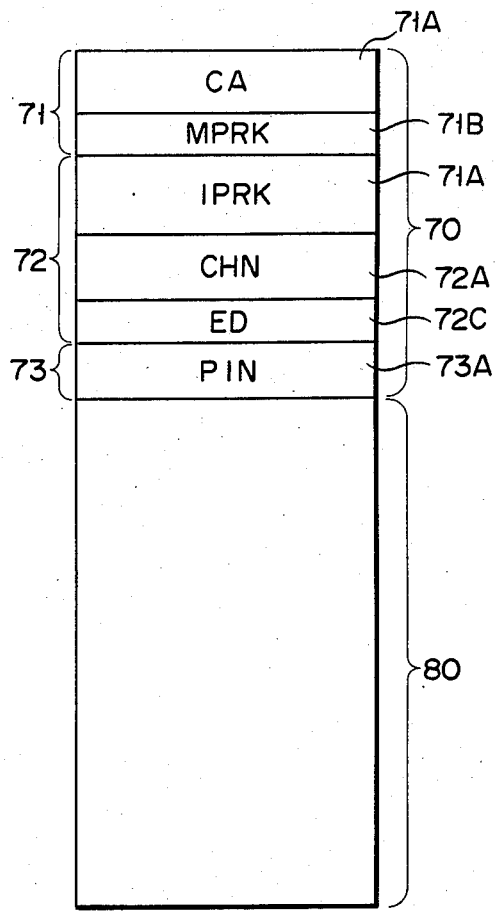
FIG. 5 is a schematic view showing memory areas of EP-ROM shown in FIG. 4.

EP-ROM 61 has memory areas as shown in FIG. 5. More specifically, EP-ROM 61 has identification data area 70, in which owner's identification data is stored, and application data area 80, in which data of the history of transactions using the IC card is stored. Identification data area 70 includes manufacturer's data section, in which data is written by the manufacturer of the IC card, issuer's data section 72, in which data is written by issuer, and owner's data section 73, in which data is written by the owner of the IC card. Manufacturer's data section 71 has CA (card authenticator) memory area 71 and MPRK (manufacturer's private key code) memory area 71B. In CA memory area 71A is stored an CA code consisting of 64 bits, for instance, which is peculier to each IC card. The CA code is transmitted to a card terminal (not shown) to be used for the computation of SAN (sales approval number).

Issuer's data section 72 has IPRK (issuer's private key code) memory area 72A, CHN (card holder is name) memory area 72B and ED (expiration date) memory area 72C. Owner's section 73 has PIN (private identification number) memory area 73A. In application data area 80, transaction data when a transaction is done using the IC card, e.g., data of the amount of the transaction, date of the transaction, SAN, etc., are stored whenever a transaction is done. The SAN is computed on the terminal side using date data, transaction amount data, etc. as well as the CA code noted above after a predetermined argorithm. The result of the computation is transmitted to and stored in the IC card.

The operation of the circuit shown in FIG. 5 will now be described. According to an input signal from a terminal, identification stored in PIN memory area 73A of EP-ROM 61 of sub-chip 6 is read out into decryption circuit 53 of main chip 5 for decryption of a crytograph. The resultant data is temporarily stored in decryption circuit 53. When the identification code memorized by the owner is input from a terminal, it is fed to memory 52 of main chip 5. In comparator 54, the identification code stored in decryption circuit 53 and the identification code stored in memory 52 are compared. If the two codes compared are coincident, a coincidence signal is provided from comparator 54 to CPU 51 to be transmitted to terminal. Subsequently, a high voltage is applied to $V_{CC}$ terminal, and transaction data is recorded in EP-ROM 61 of sub-chip 6.

In this embodiment, main chip 5 and sub-chip 6 are provided as separate IC chips in IC chard 1. Therefore, it is only necessary to alter only sub-chip 6 for different formats for the recording of transaction data required from the credit company, and main chip 5 can be used commonly. It is thus possible to efficiently use the apparatus for manufacturing IC chips.

Figure 6:
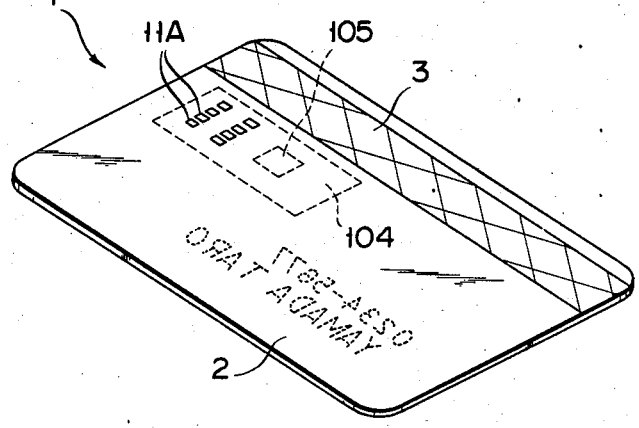
FIG. 6 is a perspective view showing a different embodiment of the IC card according to the invention.
Figure 7:
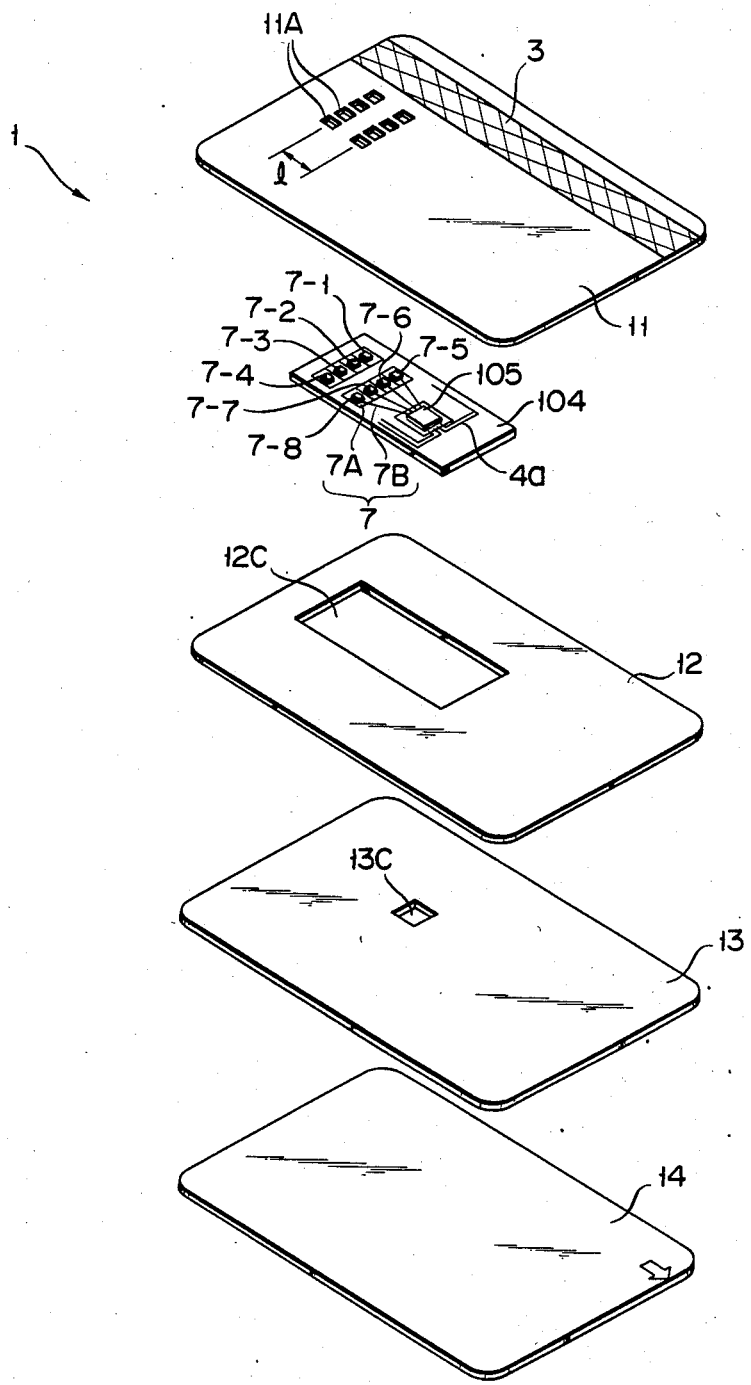
FIG. 7 is an exploded perspective view showing the IC card shown in FIG. 6.

In the above embodiment main chip 5 and sub-chip 6 are provided as separate IC chips. However, this is by no means limitative. FIGS. 6 and 7 show a different embodiment, which uses only a single IC chip.

Since this embodiment has only a single IC chip 105, substrate 104 is only as large as is sufficient to mount IC chip 105. For this reason, opening 12C provided in upper resin sheet 12 has a small size corresponding to the shape of substrate 104. Lower resin sheet 13 is provided with opening 13C corresponding to IC chip 105. The rest of the structure is the same as the preceding first embodiment, and corresponding parts are designated by like reference symbols.

With the IC card according to the invention, upper and lower resin sheets 12 and 13 may be prepared as an integral sheet. Further, it is possible to dispense with substrate 4 by forming a conductor on such an integral sheet corresponding to the upper and lower resin sheets. Further, while the foregoing description has concerned with EP-ROM as transaction data memory means, it is possible to obtain entirely the same operation using EEP-ROM (electronic erasable and programmable read-only memory). However, with the IC card according to the invention the EP-ROM or EEP-ROM is by no means limitative, and the IC chip need to have a mere memory.

As has been described in the foregoing, with the IC card according to the invention a contact segment is formed on each connection pads to an external circuit such that such that it has substantially the same thickness as the top sheet with a hole corresponding to each of the terminals. Therefore, the holes of the top sheet are substantially filled by the contact segments. It is thus possible to prevent collection of dust in the holes and ensure reliable connection of the IC chip to the external device.

What is claimed is:

1. An IC card comprising:
   at least one IC chip having electrical terminals;
   a sheet-like structure having one surface and supporting said IC chip;
   internal connecting members formed on said one surface of said sheet-like structure and including a plurality of connection pads to be connected to the external device and wiring patterns connecting said connection pads to said terminals of said IC chip;
   a sheet film having openings facing said connection pads and covering said one surface of said sheet-like structure; and
   contact segments formed on said connection pads, having a thickness substantially equal to the thickness of said sheet film and fitted in said first openings.

2. The IC card according to claim 1, each of said connection pads has a size larger than the corresponding opening of said sheet film and said contact segment is formed inwardly of said corresponding contact pad.

3. The IC card according to claim 1, wherein said IC chip includes a collation circuit for collating identification data of the owner of the card.

4. The IC card comprising:
   at least two IC chips having electrical terminals;
   a sheet-like structure having one surface and an opposite surface and supporting said IC chips, said IC chips being disposed in areas of said one surface separated in the longitudinal direction on opposite sides of a central area;
   internal connecting members formed on said one surface of said sheet-like structure and including a plurality of connection pads connected to the external device and wiring patterns connecting said connection pads and said electrical terminals of said IC chip;
   a first sheet having openings facing said connection pads and covering said one surface of said sheetlike structure;
   a second sheet covering said opposite surface of said sheet-like structure; and
   contact segments formed on said connection pads, having a thickness substantially equal to the thickness of said first sheet, fitted in said first openings and exposed from the first openings.

5. The IC card according to claim 4, wherein said sheet-like structure includes a substrate, said internal connecting members being formed thereon.

6. The IC card according to claim 5, wherein said sheet-like structure includes a third sheet supporting said substrate.

7. The IC card according to claim 5, wherein one of said IC chips includes a central processing circuit for processing a signal and a collation circuit, and the other IC chip includes a non-volatile memory having a memory area for storing a code number, capable of storing data such that the stored data can not be erased.

8. The IC card according to claim 6, wherein said memory further has three memory areas to which user's, manufacturer's and issuer's data are stored, respectively.

9. The IC card according to claim 6, wherein the other IC chip includes a memory capable of storing rewritable application data.

10. An IC module of an IC card, which includes contact segments capable of being connected to an external device, improvement of which comprises:

external connection pads arranged in rows, on which said contact segments are formed, respectively;

wiring patterns connected to said contact segments, respectively;

an insulative substrate having a surface and an opening formed thereon, said substrate surface having a first surface area for carrying said contact segments and a second surface area continued from the first surface area, on which said openings are arranged; and at least one IC chip received in the opening of said substrate and having electric terminals connected to said wiring patterns, respectively.

11. The IC card according to claim 10, wherein said wiring patterns are made of a metal foil.

12. The IC card according to claim 10, wherein said contact segments are formed on and projected from said wiring patterns.

13. The IC card according to claim 11, wherein said wiring patterns are made of a metal foil, and said contact segments are formed on and projected from said metal foils.

* * * * *